United States Patent
Yamada

(10) Patent No.: US 10,249,369 B2
(45) Date of Patent: Apr. 2, 2019

(54) SEMICONDUCTOR MEMORY DEVICE WITH FAST AND SLOW CHARGE AND DISCHARGE CIRCUITS

(71) Applicant: LAPIS Semiconductor Co., Ltd., Yokohama (JP)

(72) Inventor: Takashi Yamada, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/854,599

(22) Filed: Dec. 26, 2017

(65) Prior Publication Data

US 2018/0182444 A1 Jun. 28, 2018

(30) Foreign Application Priority Data

Dec. 27, 2016 (JP) ................................. 2016-253804

(51) Int. Cl.
*G11C 16/04* (2006.01)
*G11C 11/22* (2006.01)

(52) U.S. Cl.
CPC ............ *G11C 16/04* (2013.01); *G11C 11/221* (2013.01); *G11C 11/2255* (2013.01); *G11C 11/2273* (2013.01); *G11C 11/2297* (2013.01)

(58) Field of Classification Search
CPC .............. G11C 11/2273; G11C 11/221; G11C 11/2297; G11C 11/2255
See application file for complete search history.

(56) References Cited

U.S. PATENT DOCUMENTS

| | | | |
|---|---|---|---|
| 8,934,280 B1 * | 1/2015 | Kuo | G11C 13/0069 365/145 |
| 2005/0007832 A1 * | 1/2005 | Macerola | G11C 5/145 365/189.09 |
| 2007/0091685 A1 * | 4/2007 | Guterman | G11C 11/5628 365/185.22 |

FOREIGN PATENT DOCUMENTS

JP 2010-182353 A 8/2010

* cited by examiner

*Primary Examiner* — Ajay Ojha
(74) *Attorney, Agent, or Firm* — Rabin & Berdo, P.C.

(57) ABSTRACT

A semiconductor memory according to the present invention includes a first discharge circuit for discharging electric charge stored in a pair of bit lines; a second discharge circuit for discharging electric charge stored in the pair of bit lines; and a control part for selectively executing a low-speed discharge mode for operating only the second discharge circuit of the first and second discharge circuits, a high-speed discharge mode for operating both of the first and second discharge circuits, and a stop mode for stopping both of the first and second discharge circuits.

16 Claims, 7 Drawing Sheets

FIG. 4

| CONTROL SIGNAL | LOW-SPEED DISCHARGE MODE | STOP MODE A | STOP MODE B | HIGH-SPEED DISCHARGE MODE |
|---|---|---|---|---|
| SAEN | 0 | 0 | 1 | 1 |
| SAENb | 1 | 1 | 0 | 1 |
| DSCH | 1 | 0 | 0 | 1 |

FIG. 7

| CONTROL SIGNAL | LOW-SPEED DISCHARGE MODE | STOP MODE | | HIGH-SPEED DISCHARGE MODE |
| --- | --- | --- | --- | --- |
| | | A | B | |
| SAEN | 0 | 0 | 1 | 0 |
| SAENb | 1 | 1 | 0 | 0 |
| CH | 0 | 1 | 1 | 0 |

SEMICONDUCTOR MEMORY DEVICE WITH FAST AND SLOW CHARGE AND DISCHARGE CIRCUITS

BACKGROUND OF THE INVENTION

1. Field of the Invention

The present invention relates to a semiconductor memory, and in particular, to a semiconductor memory that has a bit line discharge or charge function.

2. Description of the Related Art

As semiconductor memories, there is proposed a semiconductor memory device that charges bit lines in advance, in other words, performs a so-called pre-charge operation when reading data out, in order to read out the data at a high speed (for example, Japanese Patent Application Laid-Open No. 2010-182353). In the semiconductor device described in the Japanese Patent Application Laid-Open No. 2010-182353, a switching element is connected to each of a pair of bit lines connected to a plurality of memory cells, to apply a charging voltage. The semiconductor memory device is a resistance change semiconductor memory, and each memory cell includes a memory cell selection transistor and a storage element for storing information depending on difference in a resistance value. According to this semiconductor memory device having this structure, by turning on the switching element only for a predetermined period in accordance with readout access, the pair of bit lines are charged and set in an initial voltage state.

As the semiconductor memories, there is known a ferroelectric memory that stores positive and negative residual dielectric polarizations depending on the hysteresis of a ferroelectric substance in correspondence with data values (0, 1), besides the above-described resistance change semiconductor memory. In the ferroelectric memory, a memory cell includes a memory cell selection transistor connected to a bit line and a ferroelectric capacitor connected between the memory cell selection transistor and a plate line.

To write data to or read data from the ferroelectric memory, bit lines are discharged to a ground potential, and thereafter a selected bit line is made in a floating potential state. Then, a predetermined voltage is applied to a plate line, to shift electric charge from the plate line to the bit line through the ferroelectric capacitor and the memory cell selection transistor. At this time, electric charge of an amount corresponding to the polarization state of the ferroelectric capacitor flows through the bit line. Thus, a sense amplifier detects the potential of the bit line that derives from the electric charge flowing through the bit line, and determines on the basis of the potential that which one of logic levels of 0 and 1 the read data value corresponds to.

SUMMARY OF THE INVENTION

When a pre-charge, as described in the Japanese Patent Application Laid-Open No. 2010-182353, is performed on the above-described ferroelectric memory, if the bit lines are charged at a high speed, the potential of the plate line temporarily varies on a positive potential side, owing to the effect of a transient of the ferroelectric capacitor included in each memory cell, and this manifests itself as noise. In the same manner, when a so-called pre-discharge, by which the bit lines are forcefully discharged, is performed, if the bit lines are discharged at a high speed, the potential of the plate line temporarily varies on a negative potential side, and this manifest itself as noise.

When the bit lines are charged or discharged at a high speed in the above pre-charge or pre-discharge, a current having a high peak value flows instantaneously due to charge or discharge, thus causing an increase in a load on a power circuit.

Thus, an object of the present invention is to provide a semiconductor memory that can prevent the occurrence of noise and reduce a load on a power circuit.

One aspect of the present invention provides a semiconductor memory including bit lines, a memory cell connected to at least one of a pair of the bit lines, and a sense amplifier connected to the pair of bit lines. The semiconductor memory includes a first discharge circuit configured to discharge electric charge stored in the pair of bit lines; a second discharge circuit configured to discharge the electric charge stored in the pair of bit lines; and a control part configured to selectively execute a low-speed discharge mode for operating only the second discharge circuit of the first and second discharge circuits, a high-speed discharge mode for operating both of the first and second discharge circuits, and a stop mode for stopping both of the first and second discharge circuits.

Another aspect of the present invention provides a semiconductor memory including bit lines, a memory cell connected to at least one of a pair of the bit lines, and a sense amplifier connected to the pair of bit lines. The semiconductor memory includes a first charge circuit configured to charge the pair of bit lines; a second charge circuit configured to charge the pair of bit lines; and a control part configured to selectively execute a low-speed charge mode for operating only the second charge circuit of the first and second charge circuits, a high-speed charge mode for operating both of the first and second charge circuits, and a stop mode for stopping both of the first and second charge circuits.

When the bit lines are discharged or charged, the present invention can selectively perform a low-speed discharge (charge) at a low discharge (charge) speed and a high-speed discharge (charge) at a high discharge (charge) speed. In a reset in which electric charge remaining in the memory cell is discharged (charged) for initialization, the low-speed discharge (charge) is performed. For example, discharge is stopped during a memory access waiting period, and when a memory access is required, the memory access is performed after the high-speed discharge (charge).

Therefore, since the plate line has reduced potential variations in response to discharge, and a current that flows instantaneously in response to discharge has a reduced peak value, as compared with using only the high-speed discharge (charge) to discharge (charge) the bit lines, it is possible to prevent the occurrence of noise and reduce a load on a power circuit.

BRIEF DESCRIPTION OF THE DRAWINGS

FIG. 4 is a table showing an example of correspondences between a discharge control signal DSCH, sense amplifier enable signals SAEN and SAENb, and operation modes in the sense amplifier part 14 having the configuration of FIG. 3;

FIG. 7 is a table showing an example of correspondences between a pre-charge control signal CH and sense amplifier enable signals SAEN and SAENb, and operation modes in the sense amplifier part 14a having the configuration of FIG. 6.

DETAILED DESCRIPTION OF THE INVENTION

An embodiment of the present invention will be described below in detail with reference to the drawings.

Figure 1:
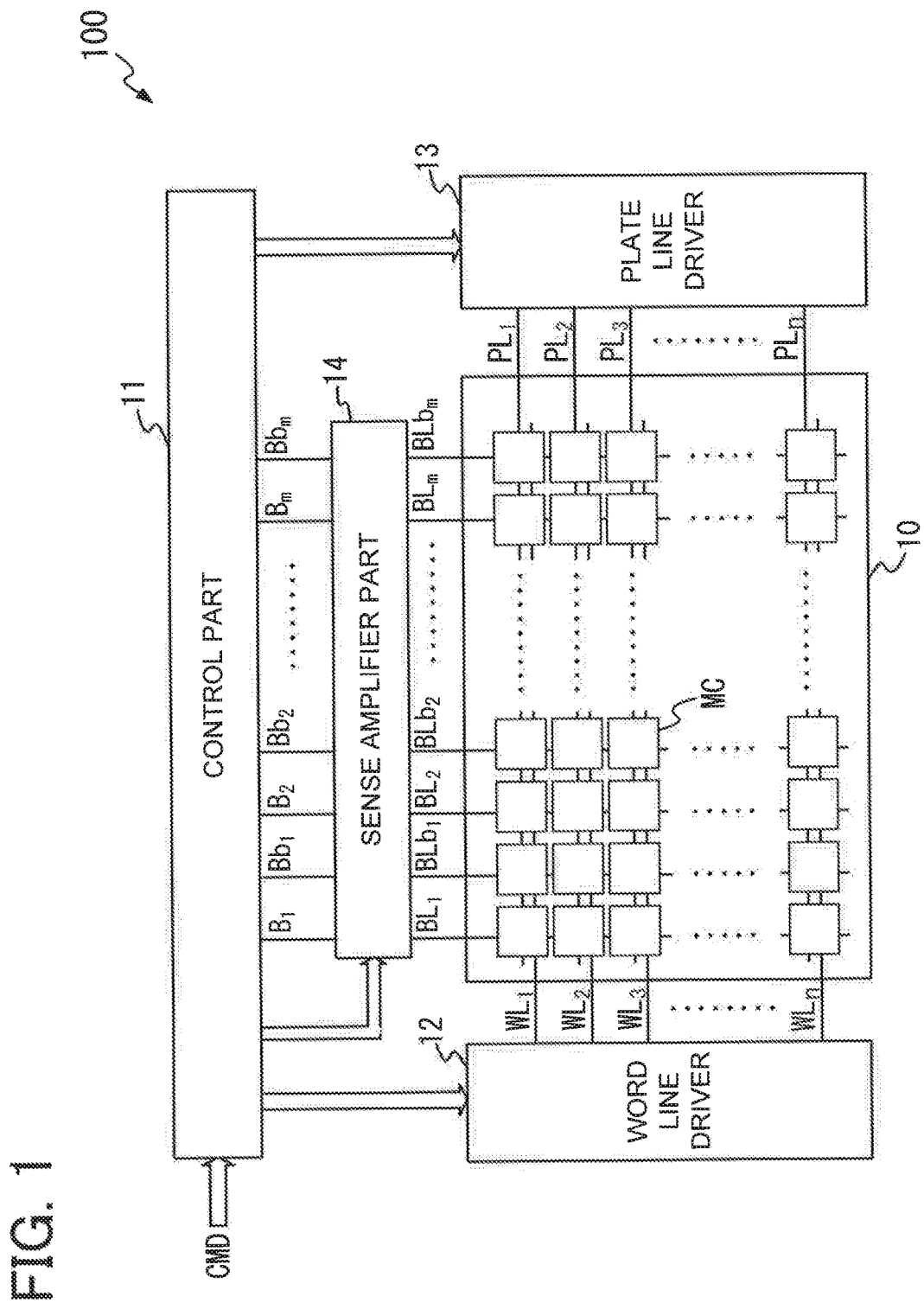
FIG. 1 is a block diagram showing a configuration of a semiconductor memory 100 according to the present invention.

FIG. 1 is a block diagram showing a schematic configuration of a semiconductor memory 100 according to the present invention. For example, the semiconductor memory 100, as a ferroelectric memory, includes a memory cell array 10, a control part 11, a word line driver 12, a plate line driver 13, and a sense amplifier part 14.

In the memory cell array 10, a plurality of word lines $WL_1$ to $WL_n$ (n is an integer of 2 or more) and a plurality of plate lines $PL_1$ to $PL_n$ are arranged alongside, and bit lines $BL_1$ to $BL_m$ and $BLb_1$ to $BLb_m$ are formed across the word lines WL and the plate lines PL. As shown in FIG. 1, the bit lines $BL_1$ to $BL_m$ and $BLb_1$ to $BLb_m$ are arranged such that the bit line $BL_k$ (k is an integer of 1 to m) and the bit line $BLb_k$ are paired up. A ferroelectric memory cell MC is formed at each intersection between the word line WL or the plate line PL and the bit line BL (BLb).

Figure 2:
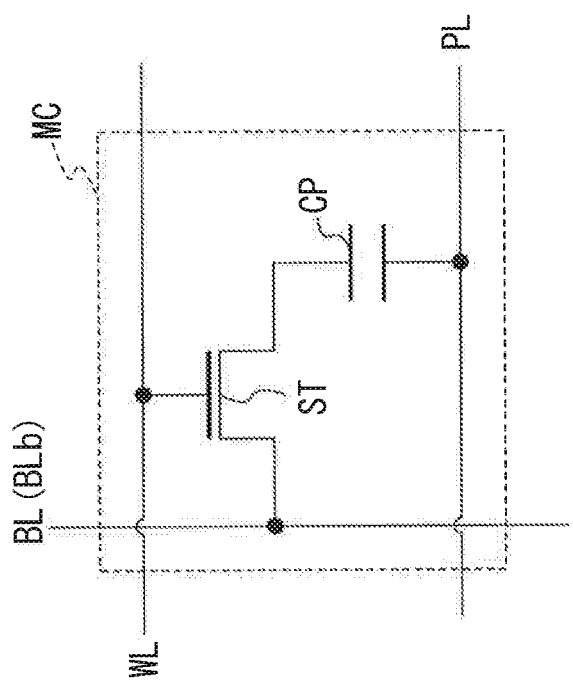
FIG. 2 is a circuit diagram showing an example of an internal configuration of a memory cell MC.

FIG. 2 is a circuit diagram showing an example of an internal configuration of the memory cell MC. As shown in FIG. 2, the memory cell MC includes an n-channel MOS (metal oxide semiconductor) transistor ST for selecting the memory cell, and a ferroelectric capacitor CP. The transistor ST is connected at its gate to the word line WL, and is connected at its source to the bit line BL or BLb. The transistor ST is connected at its drain to one end of the ferroelectric capacitor CP. The other end of the ferroelectric capacitor CP is connected to the plate line PL.

The control part 11 generates various control signals in accordance with a memory control signal CMD (a chip enable signal, a writing command signal, a readout command signal, an address signal and the like), and supplies the generated control signals to the word line driver 12, the plate line driver 13, and the sense amplifier part 14. The control part 11 also supplies a selection signal SEL to the sense amplifier part 14, to capture the potentials of the bit lines $BL_1$ to $BL_m$ and $BLb_1$ to $BLb_m$ amplified by a sense amplifier circuit through data lines $B_1$ to $B_m$ and $Bb_1$ to $Bb_m$.

The word line driver 12 applies a selection potential to a word line WL to be accessed (writing and reading) of the word lines $WL_1$ to $WL_n$, in accordance with the control signal supplied from the control part 11. The plate line driver 13 applies a plate line potential to a plate line PL to be accessed of the plate lines $PL_1$ to $PL_n$, in accordance with the control signal supplied from the control part 11.

The sense amplifier part 14 applies a bit line writing voltage to the bit lines $BL_1$ to $BL_m$ and $BLb_1$ to $BLb_m$, in accordance with the control signal supplied from the control part 11. The sense amplifier part 14 amplifies the potentials of the bit lines $BL_k$ and $BLb_k$ (k is an integer from 1 to m), and supplies the amplified potentials of the bit lines $BL_k$ and $BLb_k$ to the control part 11 through the data lines $B_k$ and $Bb_k$.

Figure 3:
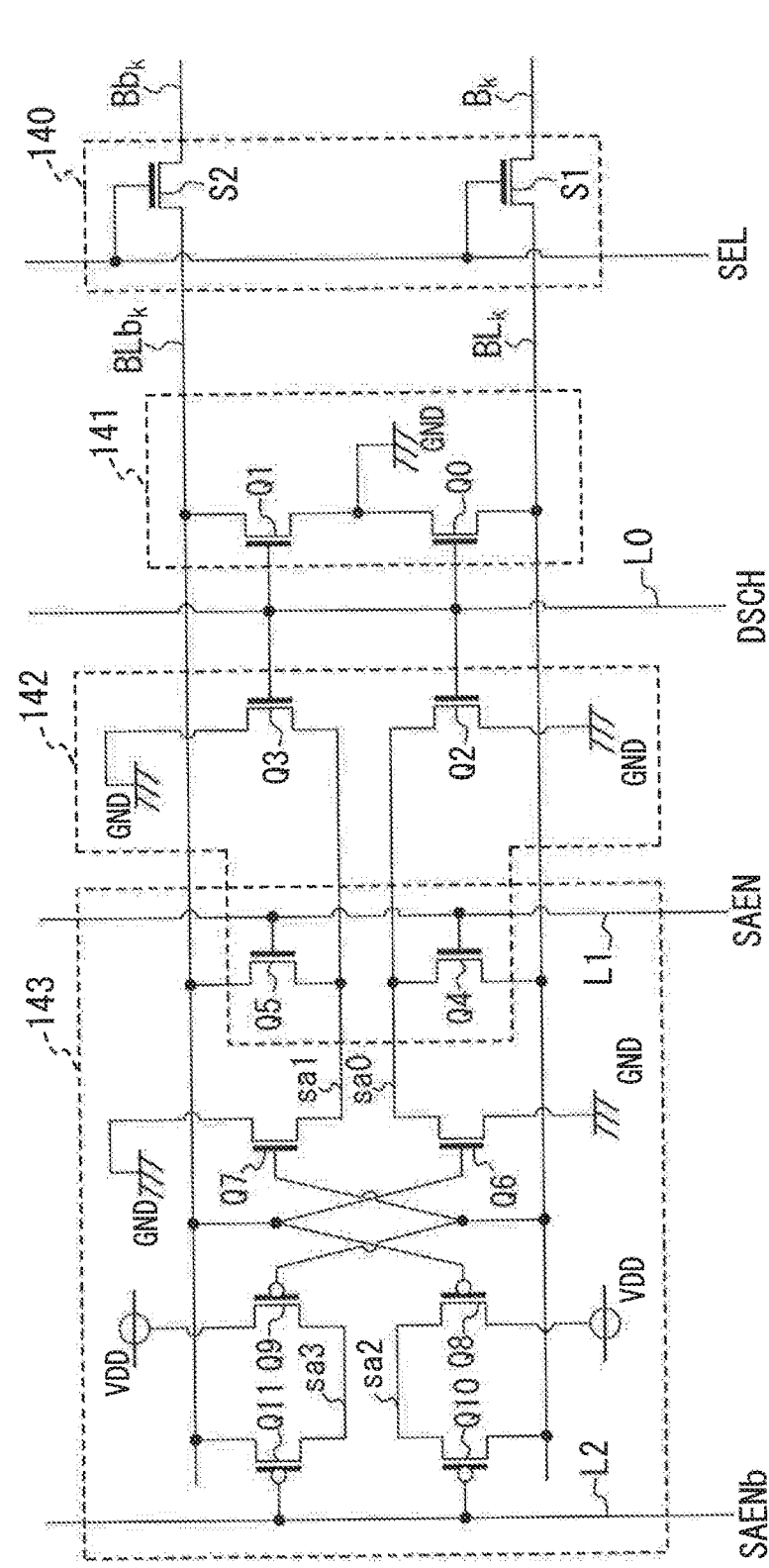
FIG. 3 is a circuit diagram showing an example of an internal configuration of a sense amplifier part 14.

FIG. 3 is a circuit diagram showing an example of an internal configuration of the sense amplifier part 14. The configuration of the sense amplifier part 14 shown in FIG. 3 has a bit line discharge function. The sense amplifier part 14 includes a data line selection circuit 140, a low-speed discharge circuit 141, a high-speed discharge circuit 142, and a sense amplifier circuit 143. The data line selection circuit 140, the low-speed discharge circuit 141, the high-speed discharge circuit 142, and the sense amplifier circuit 143 are provided for each pair of bit lines ($BL_k$ and $BLb_k$).

The data line selection circuit 140 includes n-channel MOS transistors S1 and S2 as bit line selection transistors. The transistor S1 is connected at its drain to the bit line $BL_k$ and connected at its source to the data line $B_k$. The selection signal SEL is supplied to a gate of the transistor S1.

The transistor S2 is connected at its drain to the bit line $BLb_k$, and connected at its source to the data line $Bb_k$. The selection signal SEL is supplied to a gate of the transistor S2.

According to this configuration, in the data line selection circuit 140, when the selection signal SEL having a logic level of 0 is supplied, both of the transistors S1 and S2 are turned off. When the selection signal SEL having a logic level of 1 is supplied, both of the transistors S1 and S2 are turned on, so that the bit line $BL_k$ and the data line $B_k$ are electrically connected, and the bit line $BLb_k$ and the data line $Bb_k$ are electrically connected. When data is written to the memory cell MC, the control part 11 supplies the selection signal SEL having the logic level of 1 to the data line selection circuit 140. When data is read out from the memory cell MC, the control part 11 makes a sense amplifier enable signal SAEN have a logic level of 1, while making a sense amplifier enable signal SAENb, a discharge control signal DSCH, and the selection signal SEL have a logic level of 0, during amplification by the sense amplifier circuit 143. After the completion of the amplification, the control part 11 switches the selection signal SEL to the logic level of 1.

The low-speed discharge circuit 141 includes n-channel MOS transistors Q0 and Q1 as bit line discharge transistors. The transistor Q0 is connected at its drain to the bit line $BL_k$, and connected at its source to a ground potential GND. The transistor Q1 is connected at its drain to the bit line $BLb_k$, and connected at its source to the ground potential GND. The discharge control signal DSCH having a logic level of 0 or 1 is supplied from the control part 11 to a gate of each of the transistors Q0 and Q1 through a wire L0. To discharge electric charge stored in the bit lines $BL_k$ and $BLb_k$, the control part 11 generates the discharge control signal DSCH having a logic level of 1, which indicates performing a discharge operation. To stop the discharge operation, the control part 11 generates the discharge control signal DSCH having a logic level of 0, which indicates stopping the discharge operation.

According to this configuration, in the low-speed discharge circuit 141, when the discharge control signal DSCH having the logic level of 0 is supplied, both of the transistors Q0 and Q1 are turned off. When the discharge control signal DSCH having the logic level of 1 is supplied, both of the transistors Q0 and Q1 are turned on, so that the electric charge stored in the bit lines $BL_k$ and $BLb_k$ is discharged through the transistors Q0 and Q1, respectively.

The on-state current of each of the transistors Q0 and Q1 of the low-speed discharge circuit 141 is lower than the on-state current of each of MOS transistors (described later) used in the high-speed discharge circuit 142 and the sense amplifier circuit 143. In other words, each of the transistors Q0 and Q1 has a narrower gate width than the MOS transistors used in the high-speed discharge circuit 142 and the sense amplifier circuit 143. Otherwise, the each of the transistors Q0 and Q1 has a longer gate length than the MOS transistors used in the high-speed discharge circuit 142 and the sense amplifier circuit 143.

The high-speed discharge circuit 142 includes n-channel MOS transistors Q2 to Q5. Note that the transistors Q4 and Q5 of the transistors Q2 to Q5 are shared between the high-speed discharge circuit 142 and the sense amplifier circuit 143.

The ground potential GND is applied to a source of the transistor Q2, and a drain of the transistor Q2 is connected to a source of the transistor Q4 through an internal node sa0 of the sense amplifier circuit 143. To a gate of the transistor Q2, the above-described discharge control signal DSCH is supplied through the wire L0. The ground potential GND is applied to a source of the transistor Q3, and a drain of the transistor Q3 is connected to a source of the transistor Q5 through an internal node sa1 of the sense amplifier circuit 143. To a gate of the transistor Q3, the above-described discharge control signal DSCH is supplied through the wire L0. A drain of the transistor Q4 is connected to the bit line $BL_k$, and the first sense amplifier enable signal SAEN having a logic level of 0 or 1 is supplied from the control part 11 to a gate of the transistor Q4 through a wire L1. The control part 11 generates the sense amplifier enable signal SAEN having a logic level of 1, which indicates an enable state, to make the sense amplifier circuit 143 into the enable state. The control part 11 generates the sense amplifier enable signal SAEN having a logic level of 0, which indicates a disable state, to make the sense amplifier circuit 143 into the disable state. A drain of the transistor Q5 is connected to the bit line $BLb_k$, and the above-described sense amplifier enable signal SAEN is supplied to a gate of the transistor Q5 through the wire L1.

According to the configuration, in the high-speed discharge circuit 142, when the discharge control signal DSCH having the logic level of 0 is supplied, both of the transistors Q2 and Q3 are turned off. When the sense amplifier enable signal SAEN having the logic level of 0, which makes the sense amplifier circuit 143 into the disable state, is supplied, both of the transistors Q4 and Q5 are turned off. When the discharge control signal DSCH having the logic level of 1 and the sense amplifier enable signal SAEN having the logic level of 1 are supplied, all of the transistors Q2 to Q5 are turned on. Thus, electric charge stored in the bit lines $BL_k$ and $BLb_k$ is discharged through a path constituted of the transistors Q2 and Q4 and a path constituted of the transistors Q3 and Q5, respectively.

The sense amplifier circuit 143 includes n-channel MOS transistors Q4 to Q7 and p-channel MOS transistors Q8 to Q11. The transistors Q4 and Q5, which are shared between the sense amplifier circuit 143 and the high-speed discharge circuit 142, operate as described above. The sense amplifier circuit 143 functions as a ground potential side enable switch. The ground potential GND is applied to a source of the transistor Q6, and a gate of the transistor Q6 is connected to the bit line $BLb_k$ and a gate of the transistor Q8. A drain of the transistor Q6 is connected to the source of the transistor Q4 through the internal node sa0. The ground potential GND is applied to a source of the transistor Q7, and a gate of the transistor Q7 is connected to the bit line $BL_k$ and a gate of the transistor Q9. A drain of the transistor Q7 is connected to the source of the transistor Q5 through the internal node sa1. The transistors Q6 and Q7 constitute a first differential stage of the sense amplifier.

A power supply potential VDD is applied to a source of the transistor Q8, and a drain of the transistor Q8 is connected to a source of the transistor Q10 through an internal node sa2. The power supply potential VDD is applied to a source of the transistor Q9, and a drain of the transistor Q9 is connected to a source of the transistor Q11 through an internal node sa3. The transistors Q8 and Q9 constitute a second differential stage of the sense amplifier. A drain of the transistor Q10 is connected to the bit line $BL_k$, and the second sense amplifier enable signal SAENb having a logic level of 0 or 1 is supplied from the control part 11 to a gate of the transistor Q10 through a wire L2. The control part 11 generates the sense amplifier enable signal SAENb having a logic level of 0, which indicates an enable state, to make the sense amplifier circuit 143 into the enable state. The control part 11 generates the sense amplifier enable signal SAENb having a logic level of 1, which indicates a disable state, to make the sense amplifier circuit 143 into the disable state. A drain of the transistor Q11 is connected to the bit line $BLb_k$, and the above-described sense amplifier enable signal SAENb is supplied to a gate of the transistor Q11 through the wire L2.

According to the configuration, when the control part 11 supplies the sense amplifier enable signal SAEN having the logic level of 1 and the sense amplifier enable signal SAENb having the logic level of 0, the sense amplifier circuit 143 becomes an enable state. In the enable state, the sense amplifier circuit 143 amplifies a potential difference between the bit lines $BL_k$ and $BLb_k$ to a potential difference (VDD–GND). In other words, the sense amplifier circuit 143 amplifies a higher one of the potentials of the bit lines $BL_k$ and $BLb_k$ to the power supply potential VDD, while amplifying a lower one of the potentials of the bit lines $BL_k$ and $BLb_k$ to the ground potential GND. Namely, the sense amplifier circuit 143 amplifies the minute potential difference occurring between the bit lines $BL_k$ and $BLb_k$ in accordance with electric charge sent out from the memory cell MC in readout access to the potential difference (VDD–GND). The potential of each of the bit lines $BL_k$ and $BLb_k$ is maintained after the amplification process. While maintaining the potential of each of the bit lines $BL_k$ and $BLb_k$ after the amplification process, the sense amplifier circuit 143 supplies the control part 11 with readout data signals having the potentials.

The operation of the low-speed discharge circuit 141, the high-speed discharge circuit 142, and the sense amplifier circuit 143 will be described below.

The low-speed discharge circuit 141, the high-speed discharge circuit 142, and the sense amplifier circuit 143 are operated in a low-speed discharge mode, a stop mode, or a high-speed discharge mode described below, in accordance with the discharge control signal DSCH and the sense amplifier enable signals SAEN and SAENb supplied from the control part 11.

[Low-Speed Discharge Mode]

In the low-speed discharge mode, as shown in FIG. 4, the control part 11 supplies the sense amplifier enable signal SAEN having the logic level of 0, the sense amplifier enable signal SAENb having the logic level of 1, and the discharge control signal DSCH having the logic level of 1 to the sense amplifier part 14. Thus, both of the transistors Q0 and Q1 of the low-speed discharge circuit 141 are turned on, and the bit lines $BL_k$ and $BLb_k$ (k is an integer of 1 to m) are discharged (pre-discharged) through the transistors Q0 and Q1. The potential of each of the bit lines $BL_k$ and $BLb_k$ is reduced to the ground potential GND. In the low-speed discharge mode, since both of the transistors Q4 and Q5, which are shared between the high-speed discharge circuit 142 and the sense amplifier circuit 143, are turned off in accordance with the sense amplifier enable signal SAEN having the logic level of 0, the high-speed discharge circuit 142 does not discharge the bit lines $BL_k$ and $BLb_k$.

As described above, in the low-speed discharge mode, only the low-speed discharge circuit 141, out of the low-speed discharge circuit 141 and the high-speed discharge circuit 142, discharges the bit lines $BL_k$ and $BLb_k$. The bit lines $BL_k$ and $BLb_k$ are discharged (pre-discharged) through only the first discharge path constituted of the transistors Q0 and Q1 of the low-speed discharge circuit 141, so that the potentials of the bit lines $BL_k$ and $BLb_k$ are reduced to the ground potential GND. At this time, since the on-state current of each of the transistors Q0 and Q1 is lower than the on-state current of each of the transistors Q2 to Q11 included in the high-speed discharge circuit 142 and the sense amplifier circuit 143, the bit lines $BL_k$ and $BLb_k$ are discharged at a relatively low discharge speed.

[Stop Mode]

In the stop mode, as shown in FIG. 4, the control part 11 supplies the discharge control signal DSCH having the logic level of 0 to the sense amplifier part 14. Thus, since all of the transistors Q0 to Q3 are turned off, discharge of the bit lines $BL_k$ and $BLb_k$ is stopped. The stop mode actually includes stop modes A and B, as shown in FIG. 4. In the stop mode A, both of discharge of the bit lines $BL_k$ and $BLb_k$ and the amplification operation by the sense amplifier circuit 143 are stopped. In the stop mode B, while discharge of the bit lines $BL_k$ and $BLb_k$ is stopped, the sense amplifier circuit 143 performs the amplification operation. In the stop mode A, as shown in FIG. 4, the control part 11 supplies the sense amplifier enable signal SAEN having the logic level of 0 and the sense amplifier enable signal SAENb having the logic level of 1 to the sense amplifier part 14. In the stop mode B, as shown in FIG. 4, the control part 11 supplies the sense amplifier enable signal SAEN having the logic level of 1 and the sense amplifier enable signal SAENb having the logic level of 0 to the sense amplifier part 14.

[High-Speed Discharge Mode]

In the high-speed discharge mode, as shown in FIG. 4, the control part 11 supplies the sense amplifier enable signal SAEN having the logic level of 1, the sense amplifier enable signal SAENb having the logic level of 1, and the discharge control signal DSCH having the logic level of 1 to the sense amplifier part 14. Thus, both of the transistors Q0 and Q1 of the low-speed discharge circuit 141 are turned on, and the bit lines $BL_k$ and $BLb_k$ (k is an integer of 1 to m) are discharged through the transistors Q0 and Q1. Furthermore, in the high-speed discharge mode, both of the transistors Q2 and Q3 of the high-speed discharge circuit 142 are turned on, and the transistors Q4 and Q5 thereof are turned on. Therefore, the bit line $BL_k$ is discharged through the discharge path constituted of the transistor Q4, the internal node sa0, and the transistor Q2, and the bit line $BLb_k$ is discharged through the discharge path constituted of the transistor Q5, the internal node sa1, and the transistor Q3.

As described above, in the high-speed discharge mode, the bit lines $BL_k$ and $BLb_k$ are discharged through the first discharge path including the transistors Q0 and Q1 of the low-speed discharge circuit 141, and through the second discharge path including the transistors Q4 and Q5, which are shared between the high-speed discharge circuit 142 and the sense amplifier circuit 143, the internal nodes sa0 and sa1, and the transistors Q2 and Q3. Therefore, the discharge speed is higher in the high-speed discharge mode than in the low-speed discharge mode in which the bit lines $BL_k$ and $BLb_k$ are discharged only through the first discharge path. In the high-speed discharge mode, the potentials of the bit lines $BL_k$ and $BLb_k$ quickly reach the ground potential GND, after starting discharge.

Next, an example of the operation of the low-speed discharge circuit 141, the high-speed discharge circuit 142, and the sense amplifier circuit 143 will be described with reference to a time chart of FIG. 5, by taking readout access as an example of memory access to the semiconductor memory 100.

First, in a waiting period for memory access to the semiconductor memory 100, the control part 11 supplies the sense amplifier enable signal SAEN having the logic level of 0, the sense amplifier enable signal SAENb having the logic level of 1, and the discharge control signal DSCH having the logic level of 0 to the sense amplifier part 14. Therefore, all of the transistors Q0 and Q1 of the low-speed discharge circuit 141 and the transistors Q2 and Q3 of the high-speed discharge circuit 142 are turned off, and therefore the low-speed discharge circuit 141 and the high-speed discharge circuit 142 become a discharge stop state, and the sense amplifier circuit 143 becomes a stop state (stop mode A). During the waiting period, the control part 11 supplies the selection signal SEL having the logic level of 0 to the sense amplifier part 14. Thus, both of the transistors S1 and S2 of the data line selection circuit 140 are turned off, so that the electrical connection between the bit line $BL_k$ ($BLb_k$) and the data line $B_k$ ($Bb_k$) is cut off. Furthermore, during the waiting period, the plate line driver 13 applies the plate line potential having a potential of 0 to the plate lines PL, and the word line driver 12 applies the word line selection potential having a potential of 0 to the word lines WL. Therefore, in the waiting period, the operation of the low-speed discharge circuit 141, the high-speed discharge circuit 142, and the sense amplifier circuit 143 is stopped, and both of the bit lines $BL_k$ and $BLb_k$ become a floating potential state.

Figure 5:
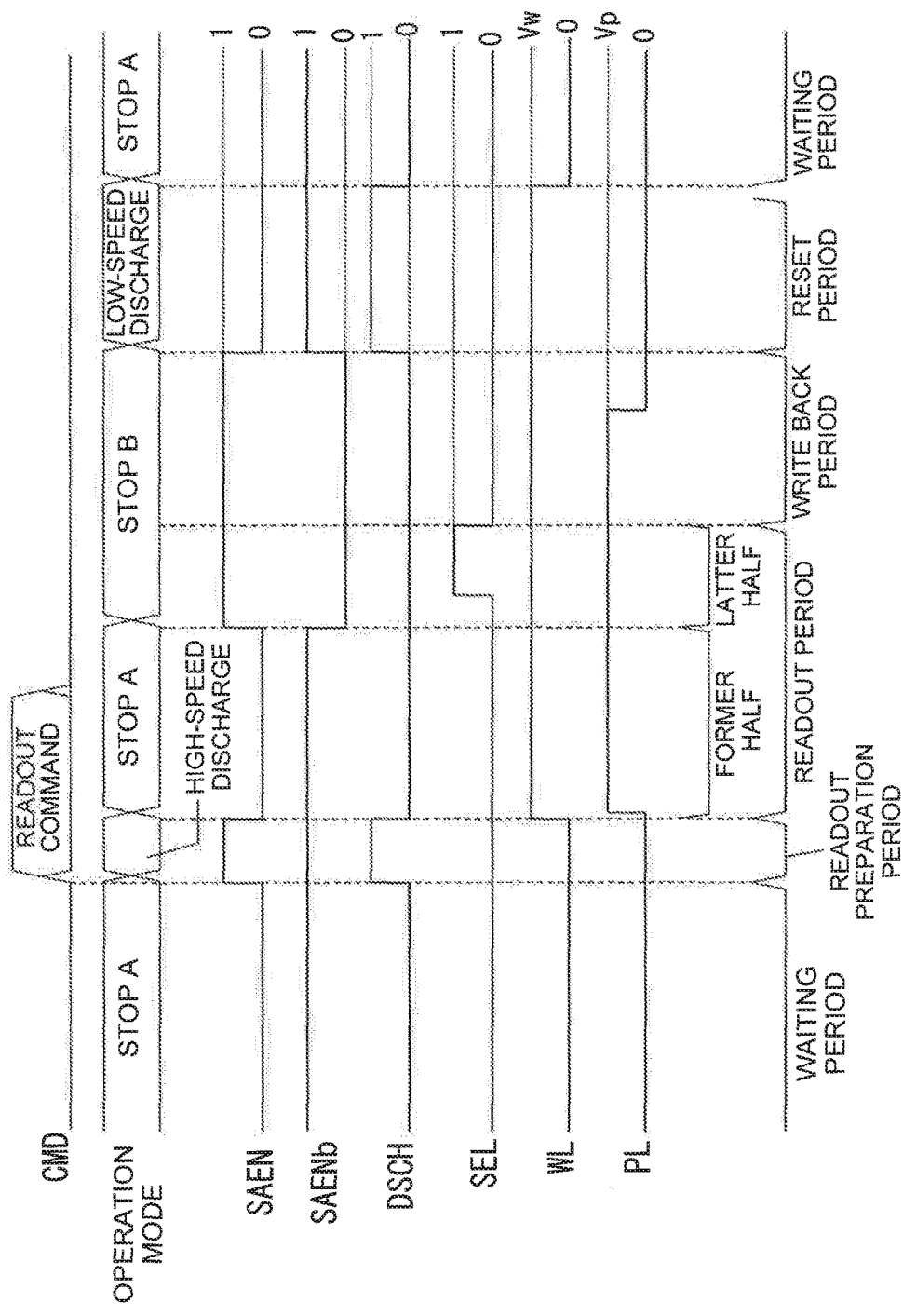
FIG. 5 is a time chart showing an example of the operation of the sense amplifier part 14.

After that, as shown in FIG. 5, when the memory control signal CMD that indicates a data readout from the memory cell is supplied, the control part 11 changes the discharge control signal DSCH and the sense amplifier enable signal SAEN from the logic level of 0 to the logic level of 1, while maintaining the sense amplifier enable signal SAENb at the logic level of 1. Therefore, the bit lines $BL_k$ and $BLb_k$ are thereby discharged through the first discharge path including the transistors Q0 and Q1 of the low-speed discharge circuit 141, and the second discharge path including the transistors Q4 and Q5, which are shared between the high-speed discharge circuit 142 and the sense amplifier circuit 143, the internal nodes sa0 and sa1, and transistors Q2 and Q3 of the high-speed discharge circuit 142 (high-speed discharge mode). In the high-speed discharge mode, the bit lines $BL_k$ and $BLb_k$ are discharged at a higher speed than in the low-speed discharge mode. An execution period of the high-speed discharge mode corresponds to a readout preparation period for the purpose of improving a margin of the data readout. During the readout preparation period, the control part 11 maintains the selection signal SEL at the logic level of 0, and the plate line driver 13 applies the plate line potential having a potential of 0 to the plate lines PL, and the word line driver 12 applies the word line selection potential having a potential of 0 to the word lines WL. By the way, in the high-speed discharge mode, the transistors ST of the memory cells MC are turned off due to the word line selection potential having a potential of 0, potential variations in the bit lines $BL_k$ and $BLb_k$ caused by discharge are not reflected in the ferroelectric capacitors CP of the memory cells MC.

Subsequent to the readout preparation period, as shown in FIG. 5, the control part 11 changes the discharge control signal DSCH from the logic level of 1 to the logic level of 0. Thus, the sense amplifier part 14 changes its operation from that of the readout preparation period to that of a readout period. In the former half of the readout period, the control part 11 supplies the sense amplifier enable signal SAEN having the logic level of 0 and the sense amplifier enable signal SAENb having the logic level of 1, as well as the discharge control signal DSCH having the logic level of 0, to the sense amplifier part 14. Therefore, all of the transistors Q0 and Q1 of the low-speed discharge circuit 141, the transistors Q2 and Q3 of the high-speed discharge circuit 142, and the transistors Q4, Q5, Q10, and Q11 of the sense amplifier circuit 143 are turned off, so that discharge of the bit lines $BL_k$ and $BLb_k$ is stopped, and the sense amplifier circuit 143 becomes the stop state (stop mode A).

At the time of starting the readout period, the word line driver 12 changes the word line selection potential from a potential 0 to a potential Vw which indicates selection of a memory cell. Subsequently the plate line driver 13 changes the plate line potential from a potential 0 to a potential Vp. Therefore, since electric charge stored in the ferroelectric capacitor CP of the memory cell MC flows into the bit line $BL_k$ ($BLb_k$), a minute potential difference occurs between the bit lines $BL_k$ and $BLb_k$.

After that, in the latter half of the readout period, the control part 11 changes the sense amplifier enable signal SAEN from the logic level of 0 to the logic level of 1, and changes the sense amplifier enable signal SAENb from the logic level of 1 to the logic level of 0. Therefore, while the low-speed discharge circuit 141 and the high-speed discharge circuit 142 are in the discharge stop state, the sense amplifier circuit 143 becomes an amplification operation execution state (stop mode B). In the stop mode B, the sense amplifier circuit 143 starts an amplification operation so as to amplify the minute potential difference between the bit lines $BL_k$ and $BLb_k$ to the potential difference (VDD–GND). Furthermore, in the latter half of the readout period, the control part 11 switches the selection signal SEL from the logic level of 0 to the logic level of 1. Therefore, the sense amplifier circuit 143 supplies the amplified potentials of the bit lines $BL_k$ and $BLb_k$ to the control part 11 through the data line selection circuit 140 and the data lines $B_k$ and $Bb_k$.

After the completion of the above-described readout period, the control part 11 switches the selection signal SEL from the logic level of 1 to the logic level of 0, to write back the electric charge held by the sense amplifier circuit 143 to the original memory cells MC (write back period). During the write back period, as shown in FIG. 5, the control part 11 maintains the sense amplifier enable signal SAENb and the discharge control signal DSCH at the logic level of 0, and maintains the sense amplifier enable signal SAEN at the logic level of 1. In the latter half of the write back period, the plate line driver 13 switches the plate line potential from the potential Vp to a potential 0. Thus, the electric charge held by the sense amplifier circuit 143 is written back to the ferroelectric capacitors CP of the memory cells MC through the bit lines $BL_k$ and $BLb_k$.

After the completion of the write back period, the control part 11 switches the sense amplifier enable signal SAENb and the discharge control signal DSCH from the logic level of 0 to the logic level of 1, and switches the sense amplifier enable signal SAEN from the logic level of 1 to the logic level of 0. Thus, both of the transistors Q0 and Q1 of the low-speed discharge circuit 141 are turned on, and the bit lines $BL_k$ and $BLb_k$ are discharged in the low-speed discharge mode (reset period). Note that, during the reset period, the control part 11 maintains the selection signal SEL at the logic level of 0, and the plate line driver 13 maintains the plate line potential at the potential of 0, and the word line driver 12 maintains the word line selection potential at the potential of Vw. Therefore, the electric charge remaining between the ferroelectric capacitor CP and the transistor ST of the memory cell MC is discharged through the bit line $BL_k$ ($BLb_k$) and the low-speed discharge circuit 141, so that the potential between the ferroelectric capacitor CP and the transistor ST is initialized to the ground potential GND.

After the completion of the reset period, the control part 11 switches the discharge control signal DSCH from the logic level of 1 to the logic level of 0, and the word line driver 12 switches the word line selection potential from the potential Vw to the potential 0. Thus, the operation changes to that of the above-described waiting period.

As described above, in the sense amplifier part 14, not only the sense amplifier circuit 143, but also the high-speed discharge circuit 142 as the first discharge circuit and the low-speed discharge circuit 141 as the second discharge circuit are connected to the pair of bit lines ($BL_k$ and $BLb_k$). This makes it possible to selectively perform the low-speed discharge mode having a low discharge speed from the bit lines, the high-speed discharge mode having a high discharge speed, and the stop mode for stopping discharge.

At this time, in the low-speed discharge mode, since discharge is performed at a lower discharge speed than in the high-speed discharge mode, the plate line PL connected to the memory cell MC has reduced potential variations, thus preventing noise owing to the potential variations. Since the low discharge speed reduces the peak value of a current that flows instantaneously in response to discharge, as compared with that in the high-speed discharge mode, it is possible to reduce a load on a power circuit.

Accordingly, the low-speed discharge mode having the low discharge speed is used for a reset in which the electric charge remaining in the memory cells is discharged (charged) for initialization after the memory access (reading or writing). During waiting period, discharge of the bit lines is stopped in the stop mode. The high-speed discharge mode having the high discharge speed is used only when returning from the waiting period. Therefore, the plate line PL has reduced potential variations on a negative potential side in response to discharge, and a current that flows instantaneously in response to discharge has a reduced peak value, as compared with using only the high-speed discharge mode to perform discharge. Therefore, it is possible to prevent the occurrence of noise and reduce a load on the power circuit. When compared with using only the low-speed discharge mode, the potentials of the bit lines are caused to quickly reach the ground potential GND, and therefore it is possible to prevent an increase in an access processing time to the memory.

In short, adopting a semiconductor memory, as the semiconductor memory 100, including the sense amplifier part (14) that is connected to the pair of bit lines ($BL_k$ and $BLb_k$) connected to the memory cells (MC) and has the following first and second discharge circuits, and the following control part 11 allows preventing the occurrence of noise and reducing a load on the power circuit. The first discharge circuit (142) is connected between the pair of bit lines, to discharge electric current stored in the pair of bit lines. The second discharge circuit (141) is connected between the pair of bit lines, to discharge electric current stored in the pair of bit lines. The control part 11 selectively performs the low-speed discharge mode in which only the second discharge circuit of the first and second discharge circuits is operated, the high-speed discharge mode in which both of the first and second discharge circuits are operated, and the stop mode in which both of the first and second discharge circuits are stopped.

The sense amplifier part 14 switches among the three modes, i.e., the low-speed discharge mode, the high-speed discharge mode, and the stop mode using the sense amplifier enable signal SAEN, which sets the sense amplifier circuit 143 in either the enable state or the disable state, as well as the existing discharge control signal DSCH. In the high-speed discharge mode, the transistors Q4 and Q5 included in the sense amplifier circuit 143 are used for forming the discharge path to discharge the bit lines.

In short, adopting the following configuration as the first discharge circuit (142), the second discharge circuit (141), and the control part 11 can switch the speed of discharging electric charge stored in the bit lines at three levels, i.e., a stop, a low speed, and a high speed, without the need for providing a new wire for mode switching control and without an increase in an occupation area of a chip.

Namely, in the low-speed discharge mode, the control part 11 sets the first control signal (DSCH) to a state indicating an execution of discharge, and sets the second control signal (SAEN) to make the sense amplifier (143) into the disable state. In the high-speed discharge mode, the control part 11 sets the first control signal (DSCH) to a state indicating the execution of discharge, and sets the second control signal (SAEN) to make the sense amplifier (143) into the enable state. In the stop mode, the control part 11 sets the first control signal (DSCH) to a state indicating a stop of discharge.

When the first control signal (DSCH) indicates the execution of discharge and the second control signal (SAEN) indicates the enable state, the first discharge circuit (142) discharges electric charge stored in the pair of bit lines. On the other hand, when the first control signal (DSCH) indicates the stop of discharge, the first discharge circuit (142) stops discharge. The second discharge circuit (141) discharges electric charge stored in the pair of bit lines when the first control signal (DSCH) indicates the execution of discharge, while stopping discharge when the first control signal (DSCH) indicates the stop of discharge.

The first discharge circuit (142) includes the following first to fourth switching elements. The second discharge circuit (141) includes the following fifth and sixth switching elements. The sense amplifier (143) includes the following first and second amplifier elements, in addition to the above-described second and forth switching elements.

Namely, when the first control signal (DSCH) indicates the execution of discharge, the first switching element (Q2) is turned on and applies the ground potential to the first internal node (sa0). When the second control signal (SAEN) indicates the enable state, the second switching element (Q4) is turned on and connects one ($BL_k$) of the pair of bit lines to the first internal node. When the first control signal (DSCH) indicates the execution of discharge, the third switching element (Q3) is turned on and applies the ground potential to the second internal node (sa1). When the second control signal (SAEN) indicates the enable state, the fourth switching element (Q5) is turned on and connects the other one ($BLb_k$) of the pair of bit lines to the second internal node. When the first control signal (DSCH) indicates the execution of discharge, the fifth switching element (Q0) is turned on and applies the ground potential to the bit line ($BL_k$). When the first control signal (DSCH) indicates the execution of discharge, the sixth switching element (Q1) is turned on and applies the ground potential to the bit line ($BLb_k$). When the potential of the bit line ($BLb_k$) is higher than that of the bit line ($BL_k$), the first amplifier element (Q6) applies the ground potential to the first internal node. When the potential of the bit line ($BL_k$) is higher than that of the bit line ($BLb_k$), the second amplifier element applies the ground potential to the second internal node. At this time, when the bit line ($BL_k$) has a higher (lower) potential than the bit line ($BLb_k$), the amplifier elements (Q6 to Q9) amplify the bit line ($BL_k$) to the power supply potential VDD (ground potential GND), and amplify the bit line ($BLb_k$) to the ground potential GND (power supply potential VDD).

FIG. 3 describes the internal configuration of the sense amplifier having the bit line discharge function as the sense amplifier part 14, but a sense amplifier having a bit line charge function may be adopted.

Figure 6:
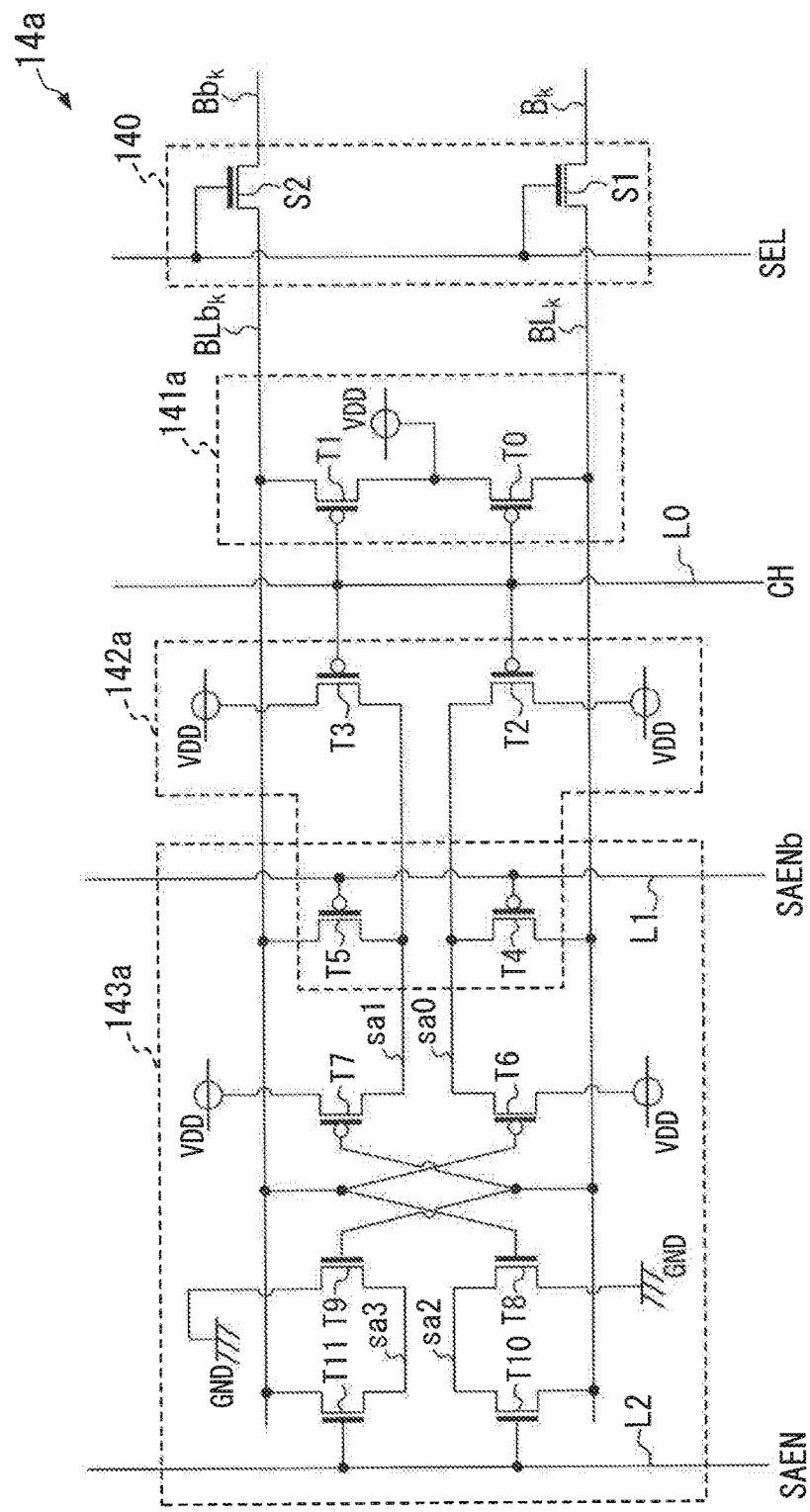
FIG. 6 is a circuit diagram showing another example of the internal configuration of the sense amplifier part 14.

FIG. 6 is a circuit diagram showing an internal configuration of a sense amplifier part 14a having a bit line charge function. The sense amplifier part 14a is adopted in place of the sense amplifier part 14 of FIG. 1. In the sense amplifier part 14a shown in FIG. 6, a low-speed charge circuit 141a, a high-speed charge circuit 142a, and a sense amplifier circuit 143a are adopted in place of the low-speed discharge circuit 141, the high-speed discharge circuit 142, and the sense amplifier circuit 143 shown in FIG. 3. The data line selection circuit 140 is the same as that shown in FIG. 3, so a description thereof is omitted. In the configuration shown in FIG. 6, p-channel MOS transistors T0 to T7 are adopted in place of the transistors Q0 to Q7 shown in FIG. 3, and re-channel MOS transistors T8 to T11 are adopted in place of the transistors Q8 to Q11 shown in FIG. 3.

In the low-speed charge circuit 141a shown in FIG. 6, a drain of the transistor T0 is connected to the bit line $BL_k$, and the power supply potential VDD is applied to a source of the transistor T0. A drain of the transistor T1 is connected to the bit line $BLb_k$, and the power supply potential VDD is applied to a source of the transistor T1. A pre-charge control signal CH having a logic level of 0 or 1 is supplied from the control part 11 to a gate of each of the transistors T0 and T1 through the wire L0. To charge (pre-charge) the bit lines $BL_k$ and $BLb_k$, the control part 11 generates the pre-charge control signal CH having a logic level of 0, which indicates an execution of charge. To stop the charge operation, the control part 11 generates the pre-charge control signal CH having a logic level of 1, which indicates a stop of charge.

According to this configuration, in the low-speed charge circuit 141a, when the pre-charge control signal CH having the logic level of 1 is supplied, both of the transistors T0 and T1 are turned off. When the pre-charge control signal CH having the logic level of 0 is supplied, both of the transistors T0 and T1 are turned on, so that the bit lines $BL_k$ and $BLb_k$ are charged (pre-charged) with the power supply potential VDD through the transistors T0 and T1, respectively.

The on-state current of each of the transistors T0 and T1 of the low-speed charge circuit 141a is lower than the on-state current of each of transistors T2 to T11 used in the high-speed charge circuit 142a and the sense amplifier circuit 143a. In other words, each of the transistors T0 and T1 has a narrower gate width than each of the transistors T2 to T11. Otherwise, each of the transistors T0 and T1 has a longer gate length than each of the transistors T2 to T11.

The high-speed charge circuit 142a shown in FIG. 6 includes the transistors T2 to T5. The transistors T4 and T5 of the transistors T2 to T5 are shared between the high-speed charge circuit 142a and the sense amplifier circuit 143a.

The power supply potential VDD is applied to a source of the transistor T2, and a drain of the transistor T2 is connected to a source of the transistor T4 through an internal node sa0 of the sense amplifier circuit 143a. To a gate of the transistor T2, the above-described pre-charge control signal CH is supplied through the wire L0. The power supply potential VDD is applied to a source of the transistor T3, and a drain of the transistor T3 is connected to a source of the transistor T5 through an internal node sa1 of the sense amplifier circuit 143a. To a gate of the transistor T3, the above-described pre-charge control signal CH is supplied through the wire L0. A drain of the transistor T4 is connected to the bit line $BL_k$, and the second sense amplifier enable signal SAENb having a logic level of 0 or 1 is supplied from the control part 11 to a gate of the transistor T4 through the wire L1. The control part 11 generates the sense amplifier enable signal SAENb having a logic level of 0, which indicates an enable state, to make the sense amplifier circuit 143a into the enable state. The control part 11 generates the sense amplifier enable signal SAENb having a logic level of 1, which indicates a disable state, to make the sense amplifier circuit 143a into the disable state. A drain of the transistor T5 is connected to the bit line $BLb_k$, and the above-described sense amplifier enable signal SAENb is supplied to a gate of the transistor T5 through the wire L1.

According to the configuration, in the high-speed charge circuit 142a, when the pre-charge control signal CH having the logic level of 1 is supplied, both of the transistors T2 and T3 are turned off. When the sense amplifier enable signal SAENb having the logic level of 1, which makes the sense amplifier circuit 143a into the disable state, is supplied, both of the transistors T4 and T5 are turned off. When the pre-charge control signal CH having the logic level of 0 and the sense amplifier enable signal SAENb having the logic level of 0 are supplied, all of the transistors T2 to T5 are turned on. Thus, the bit lines $BL_k$ and $BLb_k$ are charged with the power supply potential VDD through a path constituted of the transistors T2 and T4 and a path constituted of the transistors T3 and T5, respectively.

The sense amplifier circuit 143a shown in FIG. 6 includes the transistors T4 to T11. Out of the transistors T4 to T11, the transistors T4 and T5, which are shared between the sense amplifier circuit 143a and the high-speed charge circuit 142a, operate as described above. In the sense amplifier circuit 143a, the transistors T4 and T5 function as power supply potential side enable switches.

The power supply potential VDD is applied to a source of the transistor T6, and a gate of the transistor T6 is connected to the bit line $BLb_k$ and a gate of the transistor T8. The power supply potential VDD is applied to a source of the transistor T7, and a gate of the transistor T7 is connected to the bit line $BL_k$ and a gate of the transistor T9. The transistors T6 and T7 constitute a first differential stage of the sense amplifier.

The ground potential GND is applied to a source of the transistor T8, and a drain of the transistor T8 is connected to a source of the transistor T10 through an internal node sa2. The ground potential GND is applied to a source of the transistor T9, and a drain of the transistor T9 is connected to a source of the transistor T11 through an internal node sa3. The transistors T8 and T9 constitute a second differential stage of the sense amplifier.

A drain of the transistor T10 is connected to the bit line $BL_k$, and the first sense amplifier enable signal SAEN having a logic level of 0 or 1 is supplied from the control part 11 to a gate of the transistor T10 through the wire L2. The control part 11 generates the sense amplifier enable signal SAEN having a logic level of 1, which indicates an enable state, to make the sense amplifier circuit 143a into the enable state. The control part 11 generates the sense amplifier enable signal SAEN having a logic level of 0, which indicates a disable state, to make the sense amplifier circuit 143a into the disable state.

A drain of the transistor T11 is connected to the bit line $BLb_k$, and the above-described sense amplifier enable signal SAEN is supplied to a gate of the transistor T11 through the wire L2.

According to the configuration, when the control part 11 supplies the sense amplifier enable signal SAEN having the logic level of 1 and the sense amplifier enable signal SAENb having the logic level of 0, the sense amplifier circuit 143a becomes an enable state. In the enable state, the sense amplifier circuit 143a amplifies a potential difference between the bit lines $BL_k$ and $BLb_k$ to a potential difference (VDD−GND). In other words, the sense amplifier circuit 143a amplifies a higher one of the potentials of the bit lines $BL_k$ and $BLb_k$ to the power supply potential VDD, while amplifying a lower one of the potentials of the bit lines $BL_k$ and $BLb_k$ to the ground potential GND. Namely, the sense amplifier circuit 143a amplifies the minute potential difference occurring between the bit lines $BL_k$ and $BLb_k$ in accordance with electric charge sent out from the memory cell MC in readout access to the potential difference (VDD−GND). The potential of each of the bit lines $BL_k$ and $BLb_k$ is maintained after the amplification process. While maintaining the potential of each of the bit lines $BL_k$ and $BLb_k$ after the amplification process, the sense amplifier circuit 143a supplies the control part 11 with readout data signals having the potentials.

The operation of the low-speed charge circuit 141a, the high-speed charge circuit 142a, and the sense amplifier circuit 143 shown in FIG. 6 will be described below.

The low-speed charge circuit 141a, the high-speed charge circuit 142a, and the sense amplifier circuit 143a are operated in a low-speed charge mode, a stop mode, or a high-speed charge mode described below, in accordance with the pre-charge control signal CH and the sense amplifier enable signals SAEN and SAENb supplied from the control part 11.

[Low-Speed Charge Mode]

In the low-speed charge mode, as shown in FIG. 7, the control part 11 supplies the sense amplifier enable signal SAEN having the logic level of 0, the sense amplifier enable signal SAENb having the logic level of 1, and the pre-charge control signal CH having the logic level of 0 to the sense amplifier part 14a. Thus, both of the transistors T0 and T1 of the low-speed charge circuit 141a are turned on, and the potentials of the bit lines $BL_k$ and $BLb_k$ are increased to the power supply potential VDD through the transistors T0 and T1, respectively. In the low-speed charge mode, both of the transistors T4 and T5, which are shared between the high-speed charge circuit 142a and the sense amplifier circuit 143a, are turned off in accordance with the sense amplifier enable signal SAENb having the logic level of 1. Therefore, the high-speed charge circuit 142a does not charge the bit lines $BL_k$ and $BLb_k$.

As described above, in the low-speed charge mode, only the low-speed charge circuit 141a, out of the low-speed charge circuit 141a and the high-speed charge circuit 142a, charges the bit lines $BL_k$ and $BLb_k$. The bit lines $BL_k$ and $BLb_k$ are charged (pre-charged) through only the first charge path constituted of the transistors T0 and T1 of the low-speed charge circuit 141a, so that the potentials of the bit lines $BL_k$ and $BLb_k$ are increased to the power supply potential VDD. At this time, since the on-state current of each of the transistors T0 and T1 is lower than the on-state current of each of the transistors T2 to T11 included in the high-speed charge circuit 142*a* and the sense amplifier circuit 143*a*, the bit lines BL$_k$ and BLb$_k$ are charged at a relatively low charge speed.

[Stop Mode]

In the stop mode, as shown in FIG. 7, the control part 11 supplies the pre-charge control signal CH having the logic level of 1 to the sense amplifier part 14*a*. Thus, since all of the transistors T0 to T3 of the low-speed charge circuit 141*a* and the high-speed charge circuit 142*a* are turned off, charge of the bit lines BL$_k$ and BLb$_k$ is stopped. The stop mode actually includes stop modes A and B, as shown in FIG. 7. In the stop mode A, both of charge of the bit lines BL$_k$ and BLb$_k$ and the operation by the sense amplifier circuit 143*a* are stopped. In the stop mode B, while charge of the bit lines BL$_k$ and BLb$_k$ is stopped, the sense amplifier circuit 143*a* is activated. In the stop mode A, as shown in FIG. 7, the control part 11 supplies the sense amplifier enable signal SAEN having the logic level of 0 and the sense amplifier enable signal SAENb having the logic level of 1 to the sense amplifier part 14*a*. In the stop mode B, as shown in FIG. 7, the control part 11 supplies the sense amplifier enable signal SAEN having the logic level of 1 and the sense amplifier enable signal SAENb having the logic level of 0 to the sense amplifier part 14*a*.

[High-Speed Charge Mode]

In the high-speed charge mode, as shown in FIG. 7, the control part 11 supplies the sense amplifier enable signals SAEN and SAENb having the logic level of 0 and the pre-charge control signal CH having the logic level of 0 to the sense amplifier part 14*a*. Thus, both of the transistors T0 and T1 of the low-speed charge circuit 141*a* are turned on, and the bit lines BL$_k$ and BLb$_k$ (k is an integer of 1 to m) are charged (pre-charged) through the transistors T0 and T1. In the high-speed charge mode, both of the transistors T2 and T3 of the high-speed charge circuit 142*a* are turned on, and the transistors T4 and T5 thereof are turned on. Therefore, the bit line BL$_k$ is charged (pre-charged) to the power supply potential VDD through the charge path constituted of the transistor T4, the internal node sa0, and the transistor T2, and the bit line BLb$_k$ is charged (pre-charged) through the charge path constituted of the transistor T5, the internal node sa1, and the transistor T3.

As described above, in the high-speed charge mode, the bit lines BL$_k$ and BLb$_k$ are charged through the first charge path including the transistors T0 and T1 of the low-speed charge circuit 141*a*, and through the second charge path including the transistors T4 and T5, which are shared between the sense amplifier circuit 143*a* and the high-speed charge circuit 142*a*, the internal nodes sa0 and sa1, and the transistors T2 and T3 of the high-speed charge circuit 142*a*. Therefore, the charge speed is higher in the high-speed charge mode than in the low-speed charge mode in which the bit lines BL$_k$ and BLb$_k$ are charged only through the first charge path. In the high-speed charge mode, the potentials of the bit lines BL$_k$ and BLb$_k$ quickly reach the power supply potential VDD, after starting charge.

As described above, in the sense amplifier part 14*a* having the bit line charge function as shown in FIG. 6, not only the sense amplifier circuit 143*a*, but also the high-speed charge circuit 142*a* as the first charge circuit and the low-speed charge circuit 141*a* as the second charge circuit are connected to the pair of bit lines (BL$_k$ and BLb$_k$). This makes it possible to selectively perform the low-speed charge mode having a low charge speed to the bit lines, the high-speed charge mode having a high charge speed, and the stop mode for stopping charge.

In the low-speed charge mode, since pre-charge is performed at a lower charge speed than in the high-speed charge mode, the plate line PL connected to the memory cell MC has reduced potential variations, thus preventing noise owing to the potential variations. Since the low charge speed reduces the peak value of a current that flows instantaneously in response to charge, as compared with that in the high-speed charge mode, it is possible to reduce a load on a power circuit.

Accordingly, the bit lines are pre-charged using the low-speed charge mode having the low charge speed in a reset in which the electric charge remaining in the memory cells is charged (discharged) for initialization after the memory access (reading or writing). During waiting period, the pre-charge of the bit lines is stopped in the stop mode. Only when returning from the waiting period, the bit lines are pre-charged using the high-speed charge mode. Therefore, the plate lines PL have reduced potential variations to a positive potential side in response to charge, and have the reduced peak value of a current that flows instantaneously in response to charge, as compared with using only the high-speed charge mode to perform the pre-charge. Therefore, it is possible to prevent the occurrence of noise and reduce a load on the power circuit.

In short, adopting a semiconductor memory, as the semiconductor memory 100, including the sense amplifier part (14*a*) that is connected to the pair of bit lines (BL$_k$ and BLb$_k$) connected to the memory cells (MC) and has the following first and second charge circuits, and the following control part 11 allows preventing the occurrence of noise and reducing a load on the power circuit. The first charge circuit (142*a*) is connected to the pair of bit lines, to charge the pair of bit lines. The second charge circuit (141*a*) is connected to the pair of bit lines, to charge the pair of bit lines at the lower charge speed than the high-speed charge circuit (142*a*). The control part 11 selectively performs the low-speed charge mode in which only the second charge circuit of the first and second charge circuits is operated, the high-speed charge mode in which both of the first and second charge circuits are operated, and the stop mode in which both of the first and second charge circuits are stopped.

Furthermore, the sense amplifier part 14*a* switches among the three modes, i.e., the low-speed charge mode, the high-speed charge mode, and the stop mode using the sense amplifier enable signal SAENb, which sets the sense amplifier circuit 143*a* in either the enable state or the disable state, as well as the existing pre-charge control signal CH. In the high-speed charge mode, the transistors T4 and T5 included in the sense amplifier circuit 143*a* are shared to form the charge path for charging the bit lines.

Therefore, as in the case of the configuration shown in FIG. 3, the configuration shown in FIG. 6 allows switching between the above-described three modes, without the need for providing a new wire for mode switching control and without an increase in an occupation area of a chip.

By adding the low-speed charge circuit 141*a* and the high-speed charge circuit 142*a* shown in FIG. 6 to the configuration shown in FIG. 3, the pre-charge and the pre-discharge of the bit lines may be selectively performed. The drain of the transistor T3 of the high-speed charge circuit 142*a* is connected to the internal node sa3 of the sense amplifier circuit 143 shown in FIG. 3, and the drain of the transistor T2 of the high-speed charge circuit 142*a* is connected to the internal node sa2 of the sense amplifier circuit 143 shown in FIG. 3.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2016-253804 filed on Dec. 27, 2016, the entire contents of which are incorporated herein by reference.

What is claimed is:

1. A semiconductor memory including a memory cell, a pair of bit lines connected to said memory cell to transmit a data signal, and a sense amplifier connected to said pair of bit lines and to amplify the potentials of said pair of bit lines, said semiconductor memory comprising:
    a first discharge circuit configured to discharge electric charge stored in said pair of bit lines;
    a second discharge circuit configured to discharge the electric charge stored in said pair of bit lines; and
    a control part configured to selectively execute a low-speed discharge mode for operating only said second discharge circuit of said first and second discharge circuits, a high-speed discharge mode for operating both of said first and second discharge circuits, and a stop mode for stopping both of said first and second discharge circuits.

2. The semiconductor memory according to claim 1, wherein
    said control part generates a first control signal having such a state to indicate either an execution of discharge or a stop of discharge and a plurality of second control signals each setting said sense amplifier in either an enable state or a disable state,
    said control part, in said low-speed discharge mode, sets said first control signal to a state indicating the execution of discharge and sets at least one of the second control signals to a state indicating the disable state,
    said control part, in said high-speed discharge mode, sets the first control signal to a state indicating the execution of discharge and sets said at least one of the second control signals to a state indicating the enable state,
    said control part, in said stop mode, sets the first control signal to a state indicating the stop of discharge,
    said first discharge circuit discharges electric charge stored in the pair of bit lines when the first control signal indicates the execution of discharge and said at least one of the second control signals indicates the enable state,
    said first discharge circuit stops discharge when the first control signal indicates the stop of discharge,
    said second discharge circuit discharges electric charge stored in the pair of bit lines when the first control signal indicates the execution of discharge,
    said second discharge circuit stops discharge when the first control signal indicates the stop of discharge.

3. The semiconductor memory according to claim 2, wherein
    said first discharge circuit includes:
    a first switching element that is turned on when the first control signal indicates the execution of discharge to apply a ground potential to a first internal node;
    a second switching element that is turned on when the second control signal indicates the enable state to connect one of the pair of bit lines to said first internal node;
    a third switching element that is turned on when the first control signal indicates the execution of discharge to apply the ground potential to a second internal node; and
    a fourth switching element that is turned on when the second control signal indicates the enable state to connect the other one of the pair of bit lines to said second internal node, and
    said second discharge circuit includes:
    a fifth switching element that is turned on when the first control signal indicates the execution of discharge to apply the ground potential to said one of the bit lines; and
    a sixth switching element that is turned on when the first control signal indicates the execution of discharge to apply the ground potential to said other one of the bit lines.

4. The semiconductor memory according to claim 3, wherein
    said sense amplifier includes first and second amplifier elements that share said second and fourth switching elements with said first discharge circuit, and operate on a basis of a potential difference between the pair of bit lines,
    said second switching element is connected between said one of the pair of bit lines and said first internal node,
    said first amplifier element is connected in series to said second switching element through said first internal node, to supply either the ground potential or a power supply potential to said second switching element through said first internal node on the basis of the potential difference between the pair of bit lines,
    said fourth switching element is connected between said other one of the pair of bit lines and said second internal node, and
    said second amplifier element is connected in series to said fourth switching element through said second internal node, to supply either the ground potential or the power supply potential to said fourth switching element through said second internal node on the basis of the potential difference between the pair of bit lines.

5. The semiconductor memory according to claim 3, wherein an on-state current of each of said fifth and sixth switching elements is lower than an on-state current of each of said first to fourth switching elements.

6. The semiconductor memory according to claim 5, wherein
    said first to sixth switching elements are MOS transistors; and
    each of said fifth and sixth switching elements has a narrower gate width than each of said first to fourth switching elements.

7. The semiconductor memory according to claim 5, wherein
    said first to sixth switching elements are MOS transistors; and
    each of said fifth and sixth switching elements has a longer gate length than each of said first to fourth switching elements.

8. The semiconductor memory according to claim 1, wherein
    said control part executes said stop mode during a waiting period, and when shifting from said waiting period to a memory access period, executes said high-speed discharge mode and thereafter executes said stop mode.

9. A semiconductor memory including bit lines, a memory cell connected to at least one of a pair of the bit lines, and a sense amplifier connected to the pair of bit lines, said semiconductor memory comprising:
- a first charge circuit configured to charge the pair of bit lines;
- a second charge circuit configured to charge the pair of bit lines; and
- a control part configured to selectively execute a low-speed charge mode for operating only said second charge circuit of said first and second charge circuits, a high-speed charge mode for operating both of said first and second charge circuits, and a stop mode for stopping both of said first and second charge circuits.

10. The semiconductor memory according to claim 9, wherein
- said control part generates a first control signal having such a state to indicate either an execution of charge or a stop of charge and a plurality of second control signals each setting said sense amplifier in either an enable state or a disable state,
- said control part, in said low-speed charge mode, sets the first control signal to a state indicating the execution of charge and sets at least one of the second control signals to a state indicating the disable state,
- said control part, in said high-speed charge mode, sets the first control signal to a state indicating the execution of charge and sets said at least one of the second control signals to a state indicating the enable state,
- said control part, in said stop mode, sets the first control signal to a state indicating the stop of charge,
- said first charge circuit charges the pair of bit lines to store electric charge in the pair of bit lines when the first control signal indicates the execution of charge and said at least one of the second control signals indicates the enable state,
- said first charge circuit stops charge when the first control signal indicates the stop of charge,
- said second charge circuit charges the pair of bit lines to store electric charge in the pair of bit lines when the first control signal indicates the execution of charge,
- said second charge circuit stops charge when the first control signal indicates the stop of charge.

11. The semiconductor memory according to claim 10, wherein
said first charge circuit includes:
- a first switching element that is turned on when the first control signal indicates the execution of charge to apply a power supply potential to a first internal node;
- a second switching element that is turned on when the second control signal indicates the enable state to connect one of the pair of bit lines to said first internal node;
- a third switching element that is turned on when the first control signal indicates the execution of charge to apply the power supply potential to a second internal node; and
- a fourth switching element that is turned on when the second control signal indicates the enable state to connect the other one of the pair of bit lines to said second internal node, and said second charge circuit includes:
- a fifth switching element that is turned on when the first control signal indicates the execution of charge, to apply the power supply potential to said one of the bit lines; and
- a sixth switching element that is turned on when the first control signal indicates the execution of charge to apply the power supply potential to said other one of the bit lines.

12. The semiconductor memory according to claim 11, wherein
- said sense amplifier includes first and second amplifier elements that share said second and fourth switching elements with said first charge circuit, and operate on a basis of a potential difference between the pair of bit lines,
- said second switching element is connected between said one of the pair of bit lines and said first internal node,
- said first amplifier element is connected in series to said second switching element through said first internal node, to supply either the ground potential or a power supply potential to said second switching element through said first internal node on the basis of the potential difference between the pair of bit lines,
- said fourth switching element is connected between said other one of the pair of bit lines and said second internal node, and
- said second amplifier element is connected in series to said fourth switching element through said second internal node, to supply either the ground potential or the power supply potential to said fourth switching element through said second internal node on said basis of the potential difference between the pair of bit lines.

13. The semiconductor memory according to claim 11, wherein an on-state current of each of said fifth and sixth switching elements is lower than an on-state current of each of said first to fourth switching elements.

14. The semiconductor memory according to claim 13, wherein
- said first to sixth switching elements are MOS transistors; and
- each of said fifth and sixth switching elements has a narrower gate width than each of said first to fourth switching elements.

15. The semiconductor memory according to claim 13, wherein
- said first to sixth switching elements are MOS transistors; and
- each of said fifth and sixth switching elements has a longer gate length than each of said first to fourth switching elements.

16. The semiconductor memory according to claim 9, wherein
said control part executes said stop mode during a waiting period, and when shifting from said waiting period to a memory access period, executes said high-speed discharge mode and thereafter executes said stop mode.

* * * * *